United States Patent [19]
Zhong et al.

[11] Patent Number: 6,060,714
[45] Date of Patent: May 9, 2000

[54] LARGE AREA IMAGER WITH PHOTO-IMAGEABLE INTERFACE BARRIER LAYER

[75] Inventors: John Z. Z. Zhong, Novi; Willem den Boer, Plymouth; Young H. Byun, Novi, all of Mich.

[73] Assignee: OIS Optical Imaging Systems, Inc., Northville, Mich.

[21] Appl. No.: 09/012,491

[22] Filed: Jan. 23, 1998

[51] Int. Cl.[7] .............................. H01L 31/115; G01T 1/24
[52] U.S. Cl. ................ 250/370.09; 250/580; 250/214.1; 257/59
[58] Field of Search .............................. 250/370.09, 580, 250/214.1; 257/59

[56] References Cited

U.S. PATENT DOCUMENTS

| | | |
|---|---|---|
| 4,672,454 | 6/1987 | Cannella et al. . |
| 5,079,426 | 1/1992 | Antonuk et al. . |
| 5,381,014 | 1/1995 | Jeromin et al. . |
| 5,396,072 | 3/1995 | Schiebel et al. . |
| 5,498,880 | 3/1996 | Lee et al. . |
| 5,641,974 | 6/1997 | den Boer et al. . |
| 5,729,021 | 3/1998 | Brauers et al. ..................... 250/370.09 |
| 5,780,871 | 7/1998 | De Boer et al. .......................... 257/59 |

*Primary Examiner*—Constantine Hannaher
*Assistant Examiner*—Andrew Israel
*Attorney, Agent, or Firm*—Laff, Whitesel & Saret, Ltd.

[57] ABSTRACT

This invention is related to a radiation image (e.g. X-ray imager) including a thin film transistor (TFT) array, and method of making same. A photo-imageable interface barrier layer is provided between an array of collector electrodes and a photoconductor layer so as to simplify the process for manufacturing the imager and to improve image uniformity. In certain embodiments, the barrier layer is a negative resist. In certain embodiments, the barrier layer and an insulating layer over the TFTs may be of the same photo-imageable material.

11 Claims, 1 Drawing Sheet

LARGE AREA IMAGER WITH PHOTO-IMAGEABLE INTERFACE BARRIER LAYER

This invention relates to a method of making an image sensor including a photo-imageable interface barrier layer, and corresponding imager. More particularly, this invention relates to a method of making an imager (e.g. X-ray imager) including an array of switching elements (e.g. diodes or TFTs) wherein a photo-imageable interface barrier layer is located between the photoconductor layer and collector electrodes.

BACKGROUND OF THE INVENTION

Electronic matrix arrays find considerable application in X-ray image sensors. Such devices generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are memory cells or pixels of an electronically adjustable memory array or imager array.

Typically, a switching or isolation device(s) such as a diode or thin film transistor (TFT) is associated with each array element or pixel. The isolation devices permit the individual pixels to be selectively addressed.

Amorphous silicon (a-Si) TFTs have found wide usage for isolation devices. Structurally, TFTs generally include substantially co-planar source and drain electrodes, a thin film semiconductor material (e.g. a-Si) disposed between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted. Thus, by controlling the voltage to the gate one may read or detect the charge detected by a storage capacitor or photodiode in a corresponding imager pixel. Herein, the TFT electrode which is connected to the collector electrode is known as the "source."

Imagers including arrays of pixels are known in the art. For example, see U.S. Pat. Nos. 5,498,880; 5,396,072; 5,079,426; 4,672,454; and 5,381,014, the disclosures of which are incorporated herein by reference. For example, U.S. Pat. No. 5,381,014 discloses an X-ray imager including an array of pixels where each pixel includes a switching thin film transistor (TFT) and a storage capacitor. Over top of the TFTs and storage capacitors, a charge blocking barrier layer of aluminum oxide is provided in order to prevent charge leakage from the overlying photoconductive layer.

Alternatively, it is known to use an etchable silicon oxide barrier layer to prevent charge leakage, and to deposit such a layer via sputtering.

Unfortunately, the use of the aforesaid materials for the interface barrier layer is problematic for at least the following reasons. The processing steps to deposit and pattern such material(s) are burdensome and overly complicated. For example, cumbersome masks are often required for the sputtering deposition required for these materials in order to prevent bond pads from being coated. These masks are undesirable. Also, the potential resist coating and etching required to pattern such materials is undesirable and requires many more process/manufacturing steps that would otherwise be desirable.

It is apparent from the above that there exists a need in the art for an improved method for manufacturing a large area radiation imager, and for a corresponding imager, including a reduced number of processing/manufacturing steps being required to make the product, and an efficient charge carrier blocking material being used.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing a large area imaging device (e.g. X-ray imager) including an array of semiconductor switching elements, the imaging device comprising:

a substrate;

an array of semiconductor based switching elements (e.g. TFTs or diodes) and corresponding address lines on the substrate;

a photo-imageable organic insulating layer having a dielectric constant of less than about 5.0 provided on the substrate so that the switching elements are located between the insulating layer and the substrate;

an array of collector electrodes provided on the substrate over the organic insulating layer, and a plurality of vias defined in the insulating layer so that each collector electrode forms at least part of a storage capacitor, each storage capacitor for storing charge in an amount as a function of incident radiation received by the imager and a corresponding photoconductor layer; and a photo-imageable organic interface barrier layer located between the collector electrodes and the photoconductor layer for blocking charge carriers, the interface barrier layer being photo-imageable so as to simplify processing for manufacturing the imager.

IN THE DRAWINGS

DETAILED DESCRIPTION OF CERTAIN EMBODIMENTS OF THIS INVENTION

Figure 1:
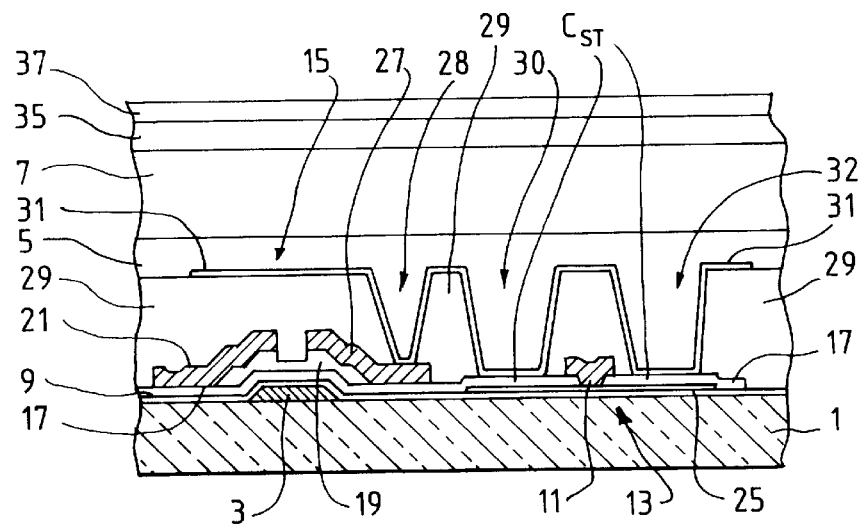
FIG. 1 is a side cross sectional view of an imager pixel according to an embodiment of this invention, an array of such pixels being provided across a substrate in order to complete an imager according to this invention.

Referring now more particularly to the accompanying drawings in which like reference numerals indicate like parts throughout the several views.

Figure 2:
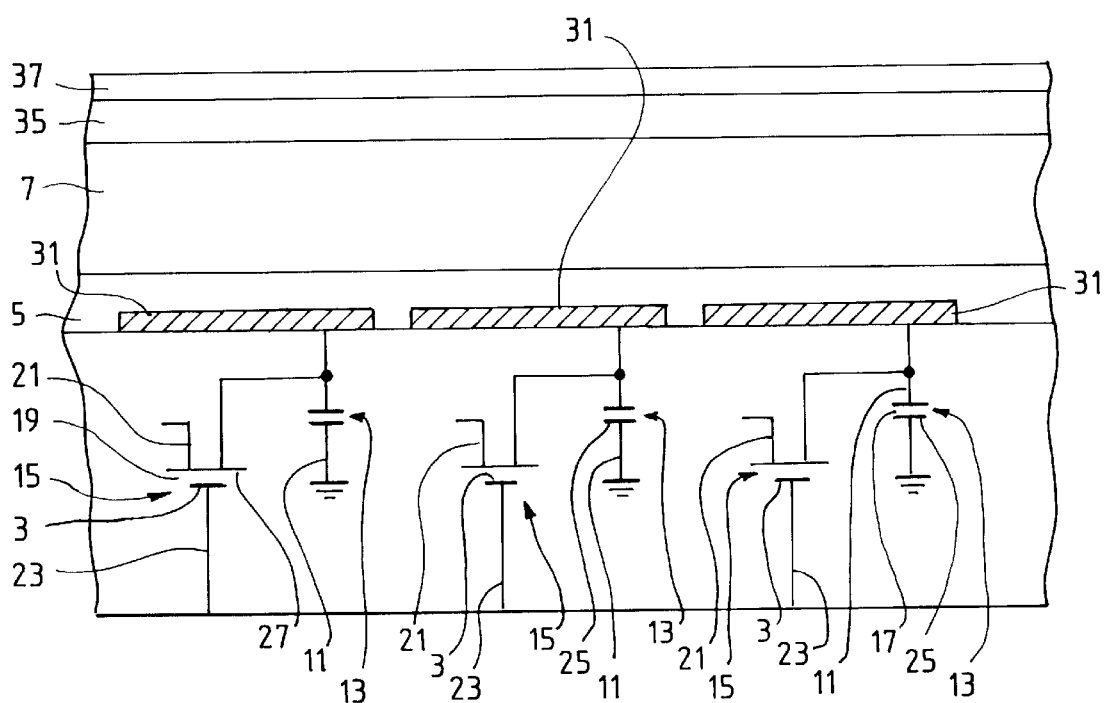
FIG. 2 is a partial schematic and partial side cross sectional view of three of the imager pixels of FIG. 1, in combination with the overlying interface barrier layer and photoconductor layer according to this invention.

FIGS. 1 and 2 illustrate a solid state imager (e.g. X-ray imager) according to an embodiment of this invention, with FIG. 1 illustrating a single pixel of the imager and FIG. 2 illustrating three of the FIG. 1 pixels. A plurality or an array of these imaging pixels are provided on substrate 1 in order to define an imager according to this invention. For example, see U.S. Pat. Nos. 5,381,014 for an array description, the disclosure of which is incorporated herein by reference.

According to this embodiment, interface barrier layer 5 is photo-imageable (e.g. a negative resist material) and has a dielectric constant value of less than about 5.0 (preferably less than about 3.5, and most preferably less than about 3.0) and functions to improve image uniformity and block charge carriers from leaking out of photoconductor layer 7. The photo-imageable nature of interface barrier layer 5 reduces the number of steps needed to make the imager, as layer 5 after it is deposited only has to be exposed to ultraviolet (UV) radiation and then developed for patterning. Thus, the imager can be manufactured more easily and efficiently than in the prior art.

Still referring to FIGS. 1–2, the X-ray imager includes, in each pixel, substantially transparent substrate 1 (e.g. glass, quartz, plastic, or the like) upon which TFT gate electrode 3, optional gate insulating layer 9, ground address line 11, storage capacitor 13 including two capacitance portions $C_{st}$, switching thin film transistor (TFT) 15, dielectric and gate insulating layer 17, a-Si semiconductor layer 19, TFT drain electrode and address line 21, gate address line 23, a via or contact hole formed in dielectric layer 17 so as to allow ground line 11 to contact the bottom electrode 25 of storage capacitor 13, TFT source electrode 27, a TFT channel, photo-imageable passivation or insulating layer 29 for improving the signal-to-noise ratio of the imager, collector electrode 31 (i.e. upper electrode) of storage capacitor 13, and bottom electrode 25 of storage capacitor 13. Blanket photoconductor layer 7 (e.g. Se, $PbI_2$, or the like), blanket insulator layer 35, and blanket metal top electrode 37 are provided on substrate 1 over interface barrier layer 5 and TFTs 15, with each of these blanket layers extending substantially continuously across the entire imaging area of the substrate 1. It is noted that in accordance with alternative embodiments of this invention, other types of switching elements (e.g. diodes or top gate TFTs) may be used instead of the illustrated bottom gate TFTs 15.

Still referring to FIGS. 1–2, each collector electrode 31 is in electrical communication with (preferably contacting) a corresponding TFT source electrode 27 through a via or contact hole 28 defined in substantially transparent insulation layer 29. A first array of vias (or apertures) 28, a second array of vias 30, and a third array of vias 32 are defined in insulation layer 29 across substrate 1. The first array of vias 28 in layer 29 enables each collector electrode 31 in the array to contact a corresponding TFT source electrode 27, while the second and third arrays of vias or apertures 30 and 32 enable each collector electrode 31 to form two parts of each storage capacitor 13.

The FIGS. 1–2 imager (e.g. X-ray imager) functions is as a "direct" conversion imager. Thus, during operation, a high voltage of several kV is applied to top electrode 37, causing the electrons and holes generated by received X-ray photons to separate. Positive charge is collected on the corresponding storage capacitor 13 and read out by the corresponding switching element (e.g. TFT 15). It is important that the interface in each pixel between the collection electrode 31 and the photoconductor 7 be completely or substantially completely blocked for charge carriers. Thus, the need for barrier layer 5, which also acts as a planarizing layer to fill in the vias or holes caused by the patterning of insulation layer 29.

During exposure to X-ray radiation (or any other type of applicable radiation desired), image-wise modulated X-ray radiation impinges upon the imager panel. The X-rays generate excess electron hole pairs within photoconductive layer 7 and, in the presence of the electric field caused by the difference in voltage between the top conducting layer 37 and the bottom electrodes, holes migrate toward the interface between photoconductive layer 7 and charge blocking layer 5 immediately adjacent and above the collector electrode 31 in each appropriate pixel. The amount of electron hole pairs generated throughout photoconductive layer 7 is dependent on the intensity of the modulated X-ray radiation impinging upon the panel. When a positive operating voltage is applied to layer 37, barrier dielectric layer 35 prevents holes from being injected into the photoconductive layer from top conductive layer 37. After a predetermined time period, radiation is stopped and the application of operating voltage on layer 37 is removed thereby capturing a radiographic image in the panel in the form of an image-wise modulated charge distribution in storage capacitors 13. Switching devices (e.g. diodes or TFTs 15) are sequentially addressed and made conductive by applying an appropriate voltage to the corresponding gate address lines 23. This causes the charge stored in the corresponding capacitors 13 to flow through the drain lines to inputs of charge detectors (not shown).

The use of photo-imageable low dielectric constant polymer (e.g. acrylic) interface barrier layer 5 improves the image uniformity of images captured by the imager because the charge blocking performed by the layer 5 is substantially complete. More imporantly, because layer 5 is photo-imageable, the processing steps needed to deposit and pattern it are minimal compared to the prior art. For example, layer 5 may be deposited as a blanket across substantially all of the imaging area of the substrate and, all unwanted portions of the layer can be removed by simple UV exposure and developing. Preferably, layer 5 is from about 200–1,000 Å thick in many areas on the substrate. Barrier layer 5 is formed of a photo-imageable material such as Fuji Clear™ (an acrylic) or a photo-imageable type of BCB (benzocyclobutene) [available from Dow Chemical] in certain embodiments. Fuji Clear™ (available from Fuji) is an organic mixture including 2-Ethoxyethyl acetate (55–70%), methacrylate derivative copolymer (10–20%), and polyfunctional acrylate (10–20%). The 2-ethoxyethyl acetate is a solvent which is removed during spinning and/or curing, and thus does not make its way into the final product.

It will be now be described how the imager is made according to an embodiment of this invention. Firstly, substantially transparent substrate 1 (e.g. of glass) is provided. Then, at least one gate metal (e.g. Al and/or Ta) is deposited on substrate 1 and patterned and etched in the form of gate electrodes 3 and the corresponding gate address lines 23. A photoresist may be used. The gate metal(s) is/are deposited on the substrate to a thickness of from about 1,000–5,000 Å. The gate metal sheet is deposited by way of sputtering or vapor deposition, and is dry etched (preferably using reactive ion etching or RIE) in order to pattern the gate metal layer in accordance with the retained photoresist pattern. To do this, the structure is mounted in a known reactive ion etching (RIE) apparatus which is then purged and evacuated in accordance with known RIE procedures and etchants.

After the gate address lines and electrodes are deposited and patterned on substrate 1 in the above-described manner, it is optional for a gate insulating or dielectric layer 9 to be deposited over substantially the entire substrate 1 preferably by plasma enhanced chemical vapor deposition (CVD) or some other process known to produce a high integrity dielectric. Gate insulating layer 9 is preferably silicon nitride ($Si_3N_4$) but may also be silicon dioxide or other known dielectrics. Gate insulating layer 9 is deposited to a thickness of from about 500–3,000 Å (preferably about 1,000 Å) according to certain embodiments. Again, gate insulating layer 9 is optional, and may not be utilized.

Then, a bottom electrode ITO [indium-tin-oxide] layer (which results in bottom storage capacitor electrodes 25) is deposited on the substrate to a thickness of about 1200 Å, and thereafter etched to form the array of bottom or ground electrodes 25. Then, a dielectric layer (which results in layer 17), preferably silicon nitride, is deposited over bottom electrodes 25 to a thickness of about 2000 Å. This layer which results in layer 17 may be the sole gate insulator in certain embodiments (i.e. layer 9 is optional).

Next, semiconductor (e.g. intrinsic a-Si) layer 19 is deposited on the substrate to a thickness of about 2,000 Å. Semiconductor layer 19 may be from about 1,000 Å to 4,000 Å thick in certain embodiments of this invention. Then, a doped (typically phosphorous doped, that is n+) amorphous silicon contact layer is deposited over intrinsic a-Si layer 19 in a known manner to a thickness of, for example, about 500 Å. The doped contact layer (not shown) may be from about 200 Å to 1,000 Å thick according to certain embodiments of this invention.

Following this, the TFT island or area may be formed by way of etching, for example, so that the TFT metal source/drain layers can be deposited thereon. For example, RIE may be used to etch the silicon semiconductor layers, and thereafter the silicon nitride (or other dielectric material) 17 is exposed to RIE to form the illustrated contact vias therein and to pattern the dielectric. The contact vias in dielectric layer 17 are formed to allow ground line 11 to contact a corresponding bottom storage capacitor electrode 25 in each pixel.

According to preferred embodiments, following the formation of the TFT islands and the vias in dielectric layer 17, a source-drain metal sheet or layer of MoTa or the like (which results in drains 21, drain address lines, sources 27, and ground address lines 11) is deposited on substrate 1 over top of patterned semiconductor layer 19 and dielectric layer 17. When MoTa, this metal layer is deposited to a thickness of about 1,000–7,000 Å, preferably about 5,000 Å according to certain embodiments. The deposited source drain metal layer sheet is then patterned (e.g. masked and etched) to form the array of source electrodes 27, the array of drain electrodes 21, the drain address lines, and ground lines 11. After patterning of drain and source portions, the a-Si n+contact layer is etched in the TFT channel area and inevitably a bit of intrinsic semiconductor layer 19 is etched along with it.

Substantially transparent polymer insulating layer 29 is then deposited onto substantially the entire imaging area of substrate 1 by way of spin-coating according to certain embodiments of this invention. Preferably, layer 29 is of a photo-imageable acrylic polymer material (e.g. Fuji Clear). Insulating layer 29 fills recesses generated upon formation of TFTs and flattens the surface above substrate 1 at least about 60–80% according to certain embodiments. This layer 29 is also deposited so that it covers ground lines 11 and is located over the storage capacitor areas on the substrate. Layer 29 is deposited to a thickness of from about 1.0 to 4.0 μm, preferably about 1.8 μm.

Photo-imageable insulating layer 29 acts as a negative resist layer according to certain embodiments of this invention so that no additional photoresist is needed to form vias 28, 30, and 32 in layer 29. In order to form the vias, layer 29 is irradiated by ultraviolet (UV) rays (e.g. i rays of 365 nm) with an i-line stepper including its stage, with UV irradiated areas of layer 29 to remain and non-exposed or non-radiated areas of layer 29 to be removed in developing. A mask may be used. Thus, the areas of negative resist 29 corresponding to the vias or apertures to be formed therein are not exposed to the UV radiation, while the rest of the layer across the substrate is exposed to UV.

Following exposure of layer 29 (except in the via areas), layer 29 is developed by using a known developing solution at a known concentration. In the developing stage, the areas of layer 29 corresponding to vias 28, 30, and 32 are removed (i.e. dissolved) so as to form the illustrated vias in layer 29. After developing, resist insulating layer 29 is cured or subjected to postbaking (e.g. about 240 degrees C. for about one hour) to eliminate the solvent so that the layer 29 with the vias therein is resinified. Thus, no dry or wet etching is needed to form the vias in layer 29. According to alternative embodiments, layer 29 may be a positive resist as opposed to a negative resist.

After the vias are formed in layer 29, a substantially transparent conductive layer (e.g. indium-tin-oxide or ITO) which results in collector electrodes 31 is deposited and patterned (e.g. photomasked and etched) over top of layer 29. After patterning of this substantially transparent conductive layer, collector electrodes 31 are left as shown. In each pixel an electrode 31 contacts a TFT source electrode 27 and a storage capacitor dielectric 17. The material for forming electrodes 31 is substantially transparent (when made of ITO) and is deposited to a thickness of from about 1,000 to 3,000 Å (preferably about 1,200 Å) according to certain embodiments of this invention. Other known materials may be used as the upper capacitor electrode layer. Collection electrodes 31 in the array may be separated by about 10 μm from each other, with each electrode covering about 86% of the corresponding pixel area including the TFT in each pixel in the array. Preferably, electrodes 31 cover at least about 80% of the pixel area on the imager panel, and most preferably at least about 85%.

After the collector electrodes 31 have been deposited and patterned, a blanket layer of photo-imageable polymer acrylic material (e.g. Fuji Clear) is deposited onto the substrate across substantially the entire imaging area to a thickness of from about 200 to 1000 Å. (this layer which is much thinner than layer 29 is to result in barrier layer 5), thereby filling in the voids and holes due to vias 28, 30, and 32 so that the product is substantially planarized at this point (i.e. preferably at least about 80%). This photo-imageable layer is a negative resist in certain embodiments, and is substantially transparent to visible wavelengths. Alternatively, this layer may be a positive resist material and/or may be substantially opaque to infrared wavelengths used in the photo-imaging.

This photo-imageable layer, when a negative resist, is then patterned by photoimaging in the same manner as layer 29 was as described above (i.e. exposure, develop) in order to remove unwanted fringe area to obtain interface barrier layer 5 as shown. In certain embodiments, layers 29 and 5 are of the same photo-imageable material.

Photoconductive layer (e.g. Se) 7, dielectric insulator layer 35, and a top metal conducting layer 37 are then formed on the substrate over barrier layer 5 in order to complete the X-ray imager.

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. An X-ray imager comprising:

a substrate;

an array of thin film transistors (TFTs) provided on said substrate, each of said TFTs including a gate electrode in electrical communication with a gate address line, a source electrode, and a drain electrode, and each of the TFTs further including a semiconductor layer;

an insulating layer provided on the substrate over the array of TFTs;

an array of collector electrodes provided on said substrate and positioned such that said insulating layer is located between said array of collector electrodes and said substrate, each of said collector electrodes being in electrical communication with a corresponding one of said TFTs through a via or aperture defined in said insulating layer, and wherein each of said collector electrodes forms part of a storage capacitor so that an array of storage capacitors are provided;

a photoconductor layer positioned on said substrate so that said insulating layer is located between said photoconductor layer and said substrate, photoconductor layer functioning so that said storage capacitors store charge in amounts that are functions of incident X-ray radiation received by the X-ray imager; and a photo-imageable interface barrier layer for simplifying the manufacturing process required to make the X-ray imager, said interface barrier layer having a thickness in many areas of from about 200 to 1000 Å and being located so that said interface barrier layer blocks charge carriers in said photoconductor from reaching said collector electrodes.

2. The imager of claim 1, wherein said interface barrier layer has a dielectric constant of less than about 5.0, and wherein said insulating layer is photo-imageable and in at least twice as thick in certain areas as said interface barrier layer.

3. The imager of claim 2, wherein said interface barrier layer has a dielectric constant of less than about 3.5.

4. The imager of claim 3, wherein said interface barrier layer has a dielectric constant of less than about 3.0.

5. The imager of claim 4, wherein said insulating layer is photo-imageable and has a dielectric constant of less than about 3.5.

6. The imager of claim 1, wherein said interface barrier layer is a negative resist and is photo-imageable via ultraviolet radiation.

7. The imager of claim 6, wherein said interface barrier layer includes an organic mixture including methacrylate derivative copolymer and polyfunctional acrylate.

8. The imager of claim 1, wherein the interface barrier layer and the insulating layer are both photo-imageable and are both of substantially the same material.

9. The imager of claim 8, wherein the interface barrier layer and the insulating layer are of the same material, and said interface barrier layer is at least 1 µm less in thickness than said insulating layer.

10. An imaging device including an array of semiconductor switching elements, the imaging device comprising:

a substrate;

an array of semiconductor based switching elements and corresponding address lines on said substrate;

a photo-imageable organic insulating layer having a dielectric constant of less than about 5.0 provided on said substrate so that said switching elements are located between said insulating layer and said substrate;

an array of collector electrodes provided on the substrate over the organic insulating layer, and a plurality of vias defined in said insulating layer so that each collector electrode forms at least part of a storage capacitor, each said storage capacitor for storing charge in an amount as a function of incident radiation received by the imager and a corresponding photoconductor layer; and a photo-imageable organic interface barrier layer located between said collector electrodes and said photoconductor layer for blocking charge carriers, said interface barrier layer being photo-imageable so as to simplify processing for manufacturing the imager.

11. A method of making an imaging device including an array of semiconductor switching elements, the method comprising the steps of:

providing a substrate;

forming an array of semiconductor based switching elements and corresponding address lines on the substrate;

depositing an organic photo-imageable insulating layer onto the substrate over the switching elements, to a thickness of from about 1.0 to 4.0 µm;

photoimaging the insulating layer in order to form a first group of vias or contact holes therein, and to form a second group of vias or contact holes therein, each via in the first group corresponding to one of the switching elements;

forming an array of electrodes over the photoimaged insulating layer so that each of the electrodes communicates with one of the switching elements through one of the vias in the first group, each of the electrodes forming part of a storage capacitor on the substrate so that an array of storage capacitors are provided;

depositing an organic photo-imageable interface barrier layer on the substrate over the electrodes to a thickness substantially less than the thickness of the insulating layer;

photoimaging the barrier layer using ultraviolet radiation in order to remove unwanted portions thereof;

forming a photoconductor layer on the substrate so that the barrier layer is located in between the photoconductor layer and the substrate; and forming a conductive layer on the substrate in a location so that the photoconductor layer is positioned between the conductive layer and the insulating layer.

* * * * *